(12) United States Patent
Buynoski et al.

(10) Patent No.: US 6,979,642 B1
(45) Date of Patent: Dec. 27, 2005

(54) METHOD OF SELF-ANNEALING CONDUCTIVE LINES THAT SEPARATES GRAIN SIZE EFFECTS FROM ALLOY MOBILITY

(75) Inventors: Matthew S. Buynoski, Palo Alto, CA (US); Connie Pin-Chin Wang, Menlo Park, CA (US); Paul R. Besser, Sunnyvale, CA (US); Minh Q. Tran, Milpitas, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/628,733

(22) Filed: Jul. 28, 2003

Related U.S. Application Data

(60) Provisional application No. 60/399,894, filed on Jul. 31, 2002.

(51) Int. Cl.$^7$ .......................................... H01L 21/283
(52) U.S. Cl. .................. 438/660; 438/674; 438/675; 438/685; 438/687
(58) Field of Search ................... 438/618, 629, 438/637, 639, 648, 656, 660, 663, 672, 674, 438/675, 685, 694, 703, 687, FOR 334, FOR 390, 438/FOR 348, FOR 405, FOR 407

(56) References Cited

U.S. PATENT DOCUMENTS

| | | | | |
|---|---|---|---|---|
| 6,022,808 | A * | 2/2000 | Nogami et al. | 438/694 |
| 6,077,780 | A * | 6/2000 | Dubin | 438/687 |
| 6,124,055 | A * | 9/2000 | Stocchiero | 429/65 |
| 6,204,179 | B1 * | 3/2001 | McTeer | 438/687 |
| 6,423,637 | B2 * | 7/2002 | Kim | 438/687 |
| 6,486,560 | B1 * | 11/2002 | Lopatin | 257/762 |
| 6,548,395 | B1 * | 4/2003 | Woo et al. | 438/622 |
| 6,630,741 | B1 * | 10/2003 | Lopatin et al. | 257/762 |
| 6,660,633 | B1 * | 12/2003 | Lopatin et al. | 438/687 |
| 6,717,236 | B1 * | 4/2004 | Lopatin et al. | 257/586 |
| 6,743,310 | B1 * | 6/2004 | Ngo | 148/525 |
| 2002/0192940 | A1 * | 12/2002 | Lee et al. | 438/633 |

* cited by examiner

Primary Examiner—George Fourson
Assistant Examiner—Joannie Adelle Garcia
(74) Attorney, Agent, or Firm—Foley & Lardner LLP

(57) ABSTRACT

A method of forming a conductive structure such as a copper conductive structure, line, or via is optimized for large grain growth and distribution of alloy elements. The alloy elements can reduce electromigration problems associated with the conductive structure. The conductive structure is self-annealed or first annealed in a low temperature process over a longer period of time. Another anneal is utilized to distribute alloy elements.

23 Claims, 3 Drawing Sheets

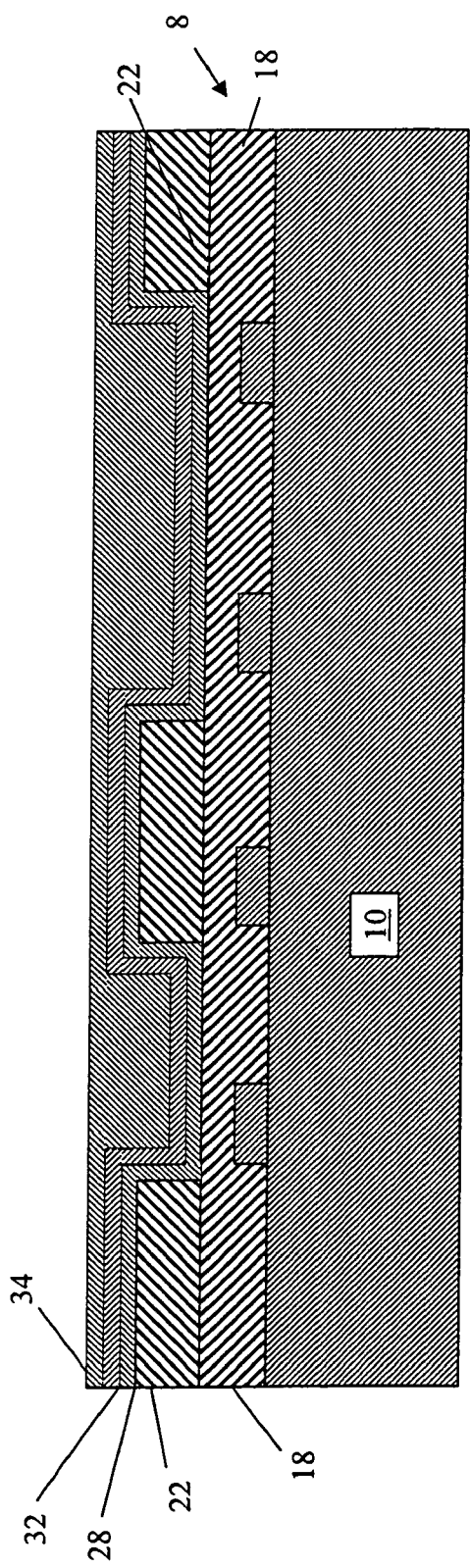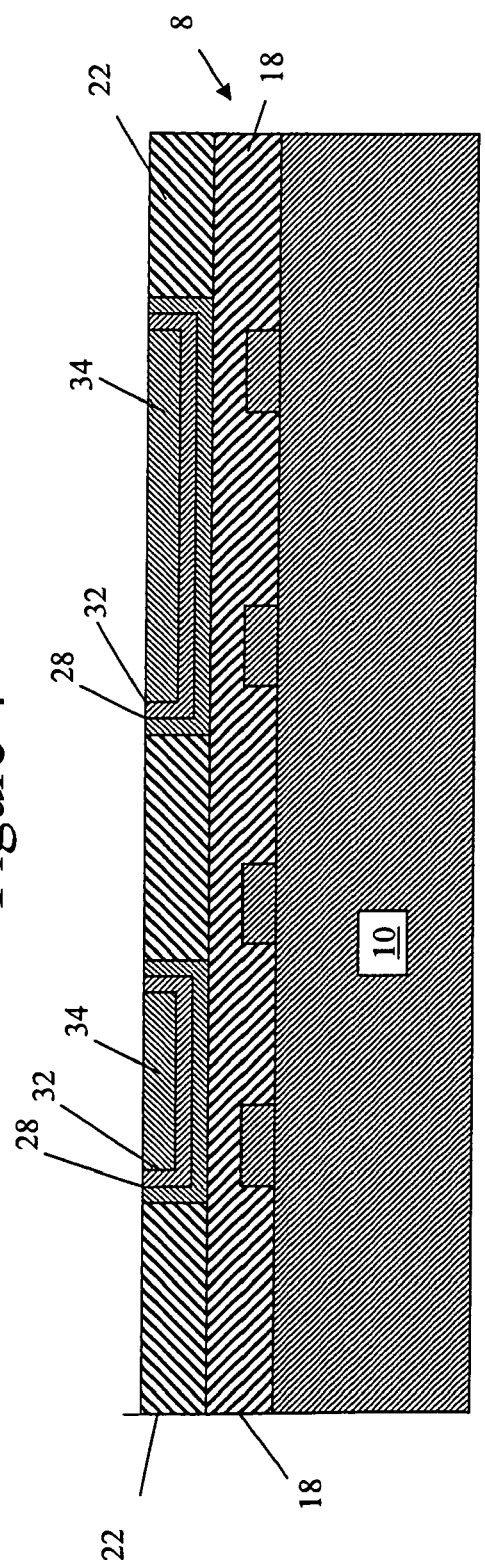

METHOD OF SELF-ANNEALING CONDUCTIVE LINES THAT SEPARATES GRAIN SIZE EFFECTS FROM ALLOY MOBILITY

CROSS-REFERENCE TO RELATED CASES

The present application claims the benefit of U.S. Provisional Application No. 60/399,894 filed Jul. 31, 2002 and is also related to U.S. application Ser. No. 10/100,395 entitled "METHOD OF PERFORMING A TWO STAGE ANNEAL IN THE FORMATION OF AN ALLOY INTERCONNECT," filed on Mar. 18, 2002 and assigned to the assignee of the present application.

FIELD OF THE INVENTION

The present invention relates generally to integrated circuits (ICs) and methods of manufacturing integrated circuits. More particularly, the present invention relates to forming conductive lines, vias, and/or interconnects with suitable alloy mobility and grain sizes.

BACKGROUND OF THE INVENTION

Semiconductor devices or integrated circuits (ICs) can include millions of devices, such as, transistors. Ultra-large scale integrated (ULSI) circuits can include complementary metal oxide semiconductor (CMOS) field effect transistors (FET). Despite the ability of conventional systems and processes to fabricate millions of IC devices on an IC, there is still a need to decrease the size of IC device features, and, thus, increase the number of devices on an IC. Nevertheless, there are many factors that make the continued miniaturization of ICs difficult. For example, as the size of conductive lines, interconnects or vias (pathways between integrated circuit layers used to electrically connect separate conductive layers) decreases, electrical resistance increases.

Conventional integrated circuits utilize conductive lines, vias, and interconnects to connect structures (e.g., gates, drain regions, source regions) and conductive lines. For example, a via can connect a gate above the substrate to a conductor line in a metal 1 layer. Vias can also interconnect conductive lines. For example, a via can connect a conductive line in a metal 1 layer to a conductive line in a metal 2 layer. A via is typically a metal plug which extends through an insulative layer in a multilayer integrated circuit.

Vias and barrier layers are discussed in U.S. Pat. Nos. 5,646,448; 5,770,519; and 5,639,691; each of which are assigned to the assignee of the present application. A barrier layer can be used to protect the via and insulative layer from metal diffusion and the via and conductive line from electromigration (EM). The barrier layer can contribute significantly to resistance associated with the via metal.

Electromigration is the mass transport due to momentum exchange between conducting electrons and diffusing metal atoms. Electromigration causes progressive damage to the metal conductors in an integrated circuit. In general, metals are most susceptible to electromigration at very high current density and temperatures of 100° C. or more.

Advances in IC fabrication techniques have enabled the use of copper (Cu) conductive lines, interconnects, vias and other structures. Typically, copper material is subject to a furnace anneal at a temperature of 250–300° C. to achieve the grain sizes of appropriate size. Larger grain sizes result in fewer grain boundaries, which in turn result in lower resistance as well as greater reliability for the conductive lines, vias, interconnects and other structures.

The performance with respect to electromigration of copper conductive lines, vias, and structures can be enhanced with the use of alloys. For example, alloy elements such as tin (Sn), zinc (Zn), indium (In), calcium (Ca), chromium (Cr), zirconium (Zr), hafnium (Hf), and lanthanum (La) can be distributed throughout a conductive line, via or other structure to reduce electromigration. However, it is desirable to use as little alloy element as possible, because the presence of alloy elements increases the resistivity of the copper structure.

Blocking electromigration in copper material by clogging grain boundaries with alloy elements is dependent on copper grain size and alloy element diffusion kinetics. Generally, the alloy elements should not be distributed within the grains of the copper structure. Instead, it is desirable to diffuse the alloy elements so that the copper grain boundaries are effectively clogged, thereby reducing electromigration problems. At higher temperatures, alloy elements can be diffused into the copper grains. Accordingly, the alloy elements must be distributed in the copper material sufficiently to clog grain boundaries without affecting the copper grain structures for optimized performance.

It is a challenge to control copper grain growth and alloy distribution when forming copper lines and other structures. It is particularly difficult to control alloy element distribution if the alloy is introduced prior to copper grain growth.

Thus, there is a need to for a method of manufacturing an IC that distributes alloy elements uniformly and yet allows suitable copper grain growth. Further, there is a need for a conductive structure having large grain growth and uniformity of alloy distribution. Even further, there is a need to improve the formation of vias, interconnects, and lines. Yet further, there is a need for a method of forming a copper structure which has uniform alloy element distribution and large copper grain size.

SUMMARY OF THE INVENTION

The exemplary embodiment relates to a method of performing a two-stage anneal in the formation of a conductive line. The method includes forming a trench in a dielectric layer, providing a seed layer in the trench, and providing copper material in the trench. The method also includes slowly annealing the copper material at a low temperature for a long period of time and subsequently annealing the copper material at a higher temperature than the low temperature and for a shorter period of time than the long period of time. Subsequently annealing the copper material distributes at least one alloy element.

Still another exemplary embodiment relates to a method of forming a copper structure in an integrated circuit fabrication process. The method includes providing a copper seed layer, electroplating the seed layer to provide copper material, and providing a first anneal. The first anneal forms large grain sizes in the copper material. The method also includes providing a second anneal to distribute alloy elements uniformly in the copper material.

Still another exemplary embodiment relates to a method of forming a damascene conductive structure in an integrated circuit. The method includes providing a copper layer, providing a source of at least one alloy element, and first annealing the copper layer to cause large grain growth over a period of time. The method can also include a second annealing of the copper layer to distribute the at least one alloy element in the copper layer.

Other principle features and advantages of the invention will become apparent to those skilled in the art upon review of the following drawings, the detailed description, and the appended claims.

BRIEF DESCRIPTION OF THE DRAWINGS

The exemplary embodiments will hereafter be described with reference to the accompanying drawings, wherein like numerals denote like elements, and:

FIG. 4 is a schematic cross-sectional view of the portion illustrated in FIG. 2, showing a material deposition step; and FIG. 5 is a schematic cross-sectional view of the portion illustrated in FIG. 2, showing a planarization step.

DETAILED DESCRIPTION OF THE EXEMPLARY EMBODIMENTS

Figure 1:
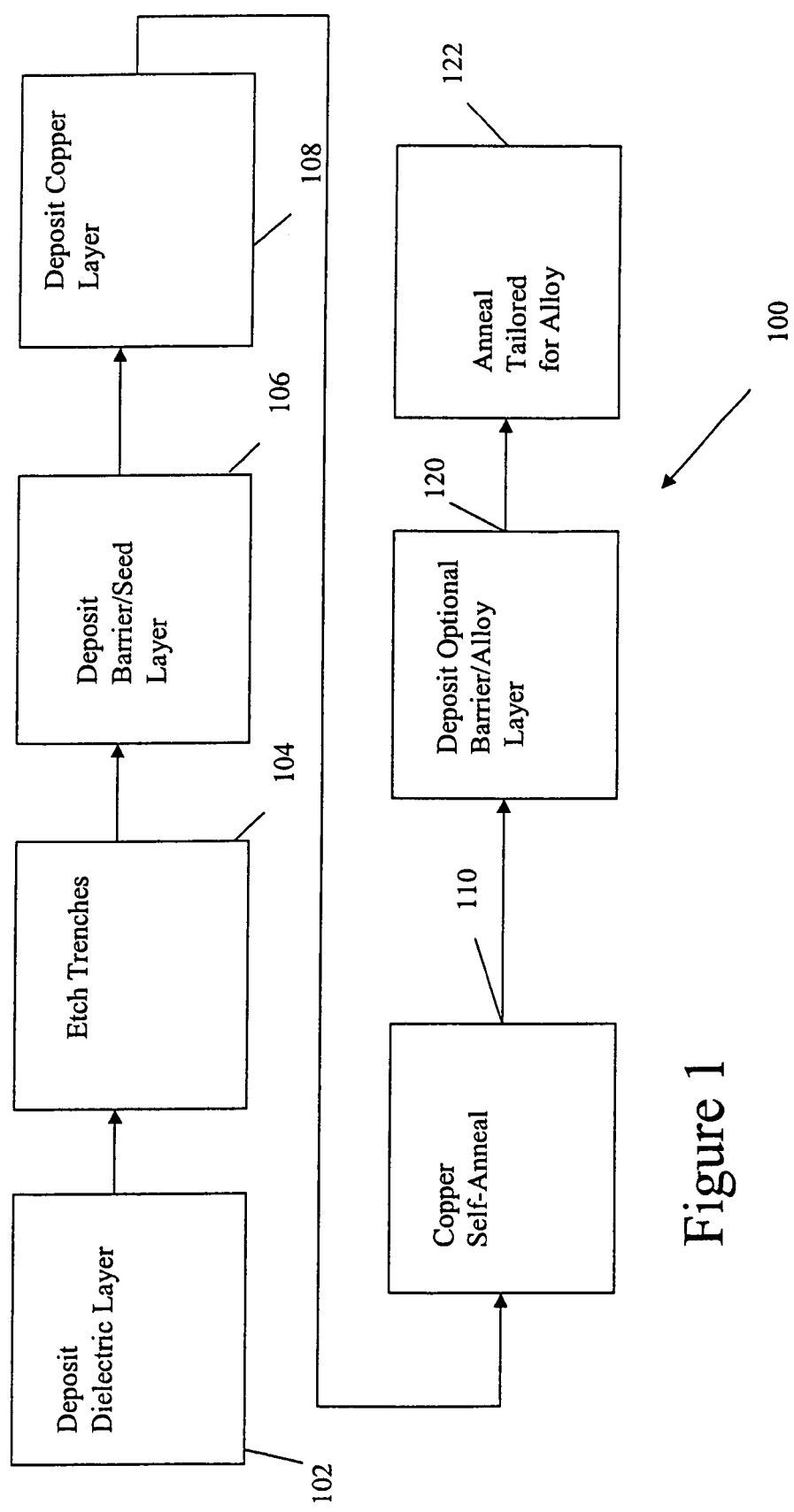
FIG. 1 is a general process flow diagram of a self-anneal-based process for forming a conductive line in accordance with an exemplary embodiment.

With reference to FIG. 1, an advantageous process 100 for forming a conductive line that is suitably protected from electromigration and that has low resistivity is disclosed. Process 100 utilizes a conductive line structure including a copper layer and alloy elements. Applicants have observed that the copper layer can be annealed separately to form large grain sizes. The separate annealing step can be a self-annealing step performed at a low temperature over a long period of time.

Applicants have observed the grain sizes in copper lines grow if allowed to anneal over a long period of time (e.g., 24 hours or longer) at low temperatures. Applicants have applied this concept to conductive line formation. Applicants believe that the grain size can be increased separately from an annealing step to clog grain boundaries of the conductive line with alloy elements. The two step annealing process improves the copper structure over conventional annealing processes.

Process 100 includes a dielectric layer formation step 102, a trench formation step 104, a barrier seed layer formation step 106 and a conductive layer formation step 108. Process 100 further includes a first annealing step 110.

Process 100 can further include a barrier layer formation step 120 and an annealing step 122. Preferably, annealing step 122 is tailored for distributing at least one alloy element to clog grain boundaries.

Process 100 can include forming vias to connect conductive lines to other conductive lines or structures associated with the substrate and contact pads. The vias can be formed by etching holes through interlevel dielectric layers. The holes can be filled in accordance with steps 106, 108 and 110 to provide a conductive via structure.

Process 100 can be similar to a conventional single damascene or dual damascene process. However, process 100 advantageously utilizes annealing steps 110 and 122 to achieve grain sizes having dimensions comparable to the thickness of the conductive line (e.g., 2,500 to 10,000 angstroms). Annealing step 122 preferably achieves suitable distribution of alloy elements in the conductive line. Step 122 is tailored for the particular size of conductive line and material used for the alloy. Preferably, time and temperature for step 122 are set to parameters necessary to diffuse alloy elements to clog grain boundaries without diffusing into the grains. Due to the larger grain sizes and clogging of grain boundaries, a lower quantity of alloy elements is required for process 100, thereby leading to lower overall resistance for the conductive line, via, or structure.

Although process 100 is described as utilizing a barrier/seed layer and an additional barrier/alloy layer in steps 106 and 120, these steps are optional and can be replaced by other steps or simply removed from process 100. Further, process 100 can be implemented in a damascene process using a deposit and polish back technique in which conformal layers are deposited in a trench and above the top surface of the wafer and subsequently removed from the top surface of the wafer. Although process 100 is described below as a damascene process, the principles of the two-stage anneal and self annealing of copper can be applied to any process of forming conductive lines, vias, or structures.

Figure 2:
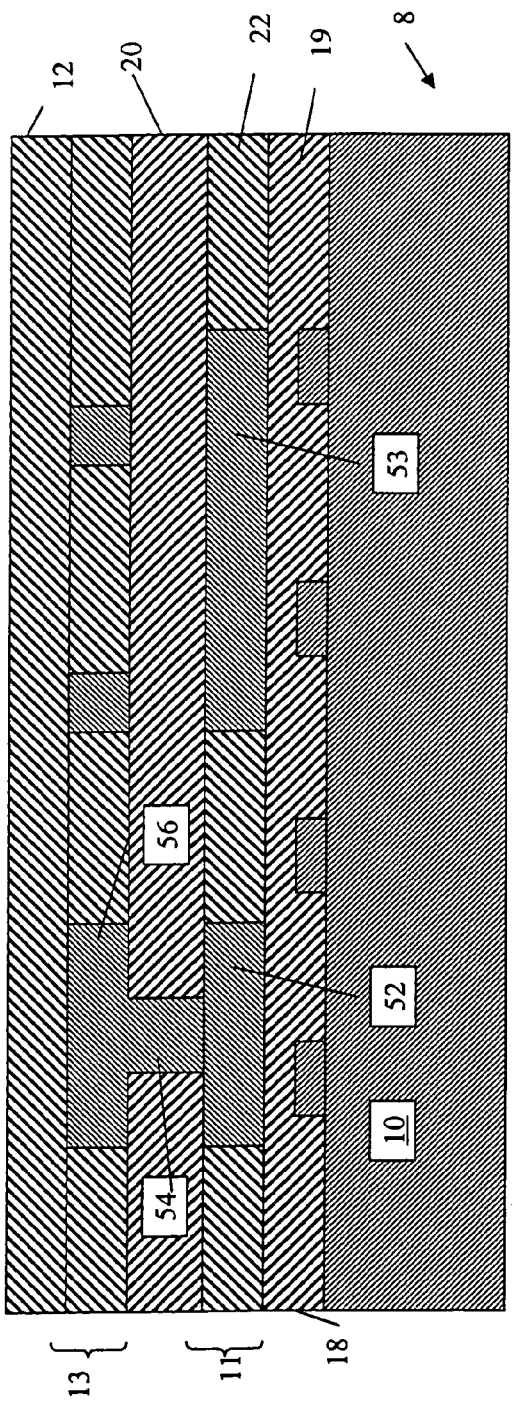
FIG. 2 is a schematic cross-sectional view of an integrated circuit including an interconnect layer with conductive lines in accordance with an exemplary embodiment of the present invention.

With reference to FIGS. 1–5, process 100 (FIG. 1) will be described below. In FIG. 2, a portion 8 of an integrated circuit includes a substrate 10 and a metal layer or interconnect layer 11 fabricated according to process 100. Portion 8 is preferably part of an ultra-large-scale integrated (ULSI) circuit having a million or more transistors. In an exemplary embodiment, portion 8 is manufactured as part of the IC on a semi-conductor wafer (e.g., a silicon wafer). Substrate 10 can be any type of IC substrate suitable for building a circuit including conductive lines.

Although portion 8 is shown with two metal or interconnect layers, the present disclosure is applicable to an integrated circuit having any number of metal or conductive layers, including a single metal layer or more than five metal layers. In addition, an interconnect layer or metal layer 13 can be fabricated according to process 100. In one embodiment, a conductive via such as a conductive via 54 can couple a conductive line 52 of interconnect layer 11 to a conductive line 56 of interconnect layer 13.

Conductive via 54 can be fabricated in accordance with process 100. In one embodiment, conductive via 54 is manufactured simultaneously with conductive line 56. Interconnect layer 13 can be similar to interconnect layer 11.

A dielectric layer 18 is disposed above substrate 10 and can cover active devices or portions thereof. The active devices can include transistors, diodes or other devices. Layer 18 includes dielectric material 19 upon which layer 11 is provided. Layer 18 can be an interlevel dielectric layer (e.g., ILD 0).

Portion 8 includes interconnect layer 11, interconnect layer 13, interlevel dielectric layer 20 (ILD 1) and interlevel dielectric layer 12 (ILD 2). Layer 20 is provided between layers 11 and 13. Conductive via 54 can connect a conductive line 52 included in layer 11 to a conductive line 56 included in layer 13. In one embodiment, conductive via 54 is integral with conductive line 56.

Layer 11 is preferably manufactured in accordance with process 100 such that conductive line 52 includes a copper material and alloy elements to reduce electromigration. The manufacture of layer 11 is described below with reference to FIGS. 3–5.

Layer 13, including conductive line 56, is preferably similar to layer 11 and manufactured according to the same process as layer 11. Layer 11 can include additional similar conductive lines such as line 53 which can be coupled to line 52, line 56, or other structures.

Conductive line 52 can be connected to other conductive lines and other conductive vias associated with portion 8.

Layer 11 can be any type of layer including at least one conductive line such as line 52. In one embodiment, layer 11 is a copper interconnect layer (e.g., metal 1, metal 2, etc.). In another embodiment, a conductive via similar to conductive via 54 can connect layer 11 to structures or doped regions on substrate 10 or to other portions of layer 13.

Interlevel dielectric layer 20 can be an insulative layer or can be any of a variety of different materials into which diffusion or migration is undesirable. For example, interlevel dielectric layer 20 may be a phosphorous-silicate-glass (PSG), boron-silicate-glass (BSG), silicon dioxide ($SiO_2$), low dielectric constant material, compound layers of insulative materials, or the like. Interlevel dielectric layer 20 may also include dopant elements such as fluorine (F), carbon (C), boron (B), phosphorous (P), silicon (Si), and nitrogen (N).

Conductive line 52 included in interconnect layer 11 can include copper (Cu), aluminum (Al), or any other conductive material used in the formation of lines, vias, and the like in an integrated circuit. In an exemplary embodiment, conductive line 52 of metal layer 11 includes copper.

In a preferred embodiment, conductive lines 52 and 53 of metal layer 11 include a seed layer of copper, a copper fill layer, and a barrier material. The barrier material or the seed layer can include alloy elements. The alloy elements can include at least one of tin (Sn), calcium (Ca), chromium (Cr), zinc (Zn), zirconium (Zr), hafnium (Hf), or lanthanum (La). The barrier layers can include at least one of tantalum (Ta), titanium nitride (TiN), titanium silicon nitride (TiSiN), tungsten nitride (WNx), tantalum nitride (TaN), tantalum silicon nitride (TaSiN), and tungsten carbon nitride (WCNx).

Figure 3:
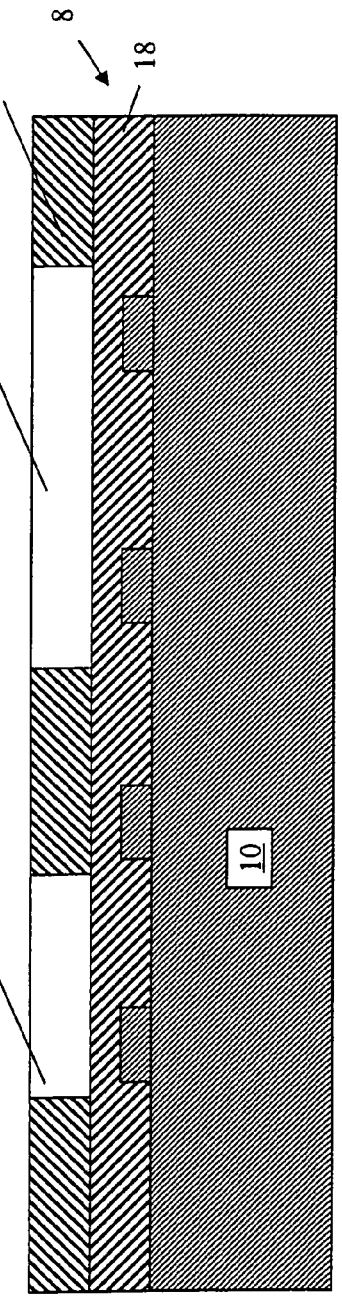
FIG. 3 is a schematic cross-sectional view of the portion illustrated in FIG. 2, showing a trench formation step.

With reference to FIG. 3, dielectric material 22 is deposited in step 102 (FIG. 1) above layer 18. Layer 22 can be deposited or formed by any conventional process. Preferably, layer 22 includes silicon dioxide and is deposited by chemical vapor deposition (CVD). According to one embodiment, layer 22 is a tetraethylorthosilicate (TEOS) deposited silicon dioxide layer having a thickness of between approximately 2,500 and 10,000 angstroms.

After deposition, layer 22 is patterned and etched to form trenches 26 in step 104. Trenches 26 are used to form conductive lines 52 and 53 according to a damascene technique. Layer 22 can be etched in a dry etching process. Trenches 20 can have widths of approximately 0.1 to several micrometers (e.g., 0.18 micrometers). Alternative removal processes can also be utilized to form trenches 26.

With reference to FIG. 4, a barrier layer 28 is deposited above layer 22 and in trenches 26 in step 106. Preferably, a conductive barrier material is provided as barrier layer 28. Preferably, barrier layer 28 is a 10–100 angstroms thick layer of conformally deposited tantalum. In an alternative embodiment, barrier layer 28 can be made of tantalum nitride (TaN). Layer 28 is preferably chosen so that it adheres to layer 22. Types of barrier materials which have shown suitable adhesion to layer 22 include tantalum (Ta), titanium nitride (TiN), titanium silicon nitride (TiSiN), tungsten nitride (WNx), tantalum nitride (TaN), tantalum silicon nitride (TaSiN), and tungsten carbon nitride (WCNx). The barrier material may include alloy elements as described above.

Layer 28 can be deposited in a number of ways, including advanced sputtering techniques utilizing a barrier material target, electrochemical deposition (both electroplating and/or electroless), chemical vapor deposition, and combinations of advanced sputtering techniques and electrochemical depositions. Preferably, sputtering deposition is utilized.

A copper seed layer 32 is deposited in step 108. Layer 32 is preferably deposited above or over layer 28 and within trenches 26. Layer 32 can be a pure copper layer. Alternatively, layer 32 can be a copper alloy. In one embodiment, layers 28 and 32 can be a single barrier/seed layer. Such an embodiment can deposit (e.g., by sputtering) an approximately 250 angstroms thick layer of tantalum (Ta) and an approximately 1000 angstroms thick layer of copper as the barrier and seed layer, respectively.

Similar to layer 28, layer 32 can be deposited using advanced sputtering techniques, electrochemical deposition, or combinations of advanced sputtering techniques and electrochemical depositions. Preferably, layer 32 is deposited by sputtering deposition.

Layer 32 can include copper alloy elements such as tin (Sn), calcium (Ca), chromium (Cr), zinc (Zn), indium (In), zirconium (Zr), hafnium (Hf), lanthanum (La), etc., having a concentration from 0.1 to 5.0 atomic percent. Layer 32 can have a thickness of less than 1,000 angstroms. According to a preferred embodiment, layer 32 includes alloy elements. Layer 32 can be deposited by sputtering with a copper target with alloy elements.

A copper fill material 34 is provided above or over layer 32 and in trenches 26 at a step 108. Preferably, copper fill material 34 is pure copper and is formed in an electroplating process upon seed layer 32. Material 34 is preferably approximately 10,000 angstroms thick.

In step 110, layer 34 is allowed to self-anneal over a relatively long period of time such as 24–48 hours at a temperature of less than 100° C. (e.g., room temperature). In an alternative embodiment, a low temperature anneal at a temperature of approximately 60° C. for between approximately 8–24 hours can be utilized. Due to the low temperature anneal, there is relatively little appreciable diffusion or motion of alloy elements from layer 28 or 32 when grain growth of material 34 occurs.

As shown in FIG. 5, layers 28, 32, and 34 are subjected to a chemical mechanical polish (CMP) process to remove portions of layers 28, 32, and 34 extending above layer 22. The result is a planar surface aligned with the top or upper surface of layer 22.

In step 122, conductive line 52 (including layer 34) is further annealed with annealing conditions tailored exclusively for the needs of distributing alloy elements without affecting copper grain structure. In one embodiment, a furnace anneal of less than 400° C. (e.g., 250–350° C.) for a shorter period of time than the anneal in step 110 may be performed. The annealing parameters can be adjusted according to the type of alloy elements utilized and other factors. In one embodiment, if 1.0 atomic percent tin (Sn) is utilized as an annealing element, step 122 provides a 250° C. temperature anneal for approximately 600 seconds.

Contrary to conventional processes, process 100 utilizes a longer annealing process which adversely affects throughput associated with the semiconductor fabrication process. However, process 100 achieves an advantage of superior copper structure due to the use of the separate annealing process.

While the above exemplary embodiments have been described with regard to a damascene copper metal line process, other line formation processes can be utilized. For example, line 52 can be fabricated in a dual damascene process. Further, system parameters and design criteria can affect the selection of materials and line thicknesses without departing from the scope of the invention. For example, adhesion parameters, trench steps, etc. can determine the types of materials and, number of layers and thicknesses of layers associated with the conductive line.

While the exemplary embodiments illustrated in the FIGURES and described above are presently preferred, it should be understood that these embodiments are offered by way of example only. Other embodiments may include, for example, different deposition methods or different alloy elements. The invention is not limited to a particular embodiment, but extends to various modifications, combinations, and permutations that nevertheless fall within the scope and spirit of the appended claims.

What is claimed is:

1. A method of performing a two stage anneal in the formation of a conductive line, the method comprising:
   forming a trench in a dielectric layer;
   providing a seed layer in the trench;
   providing a copper material in the trench;
   annealing the copper material at a low temperature for a long period of time, the long period of time being greater than 8 hours; and
   subsequently annealing at a higher temperature than the low temperature and for a shorter period of time than the long period of time the copper material to distribute at least one alloy element.

2. The method of claim 1, further comprising providing a barrier layer along lateral side walls of the trench, the barrier layer being disposed between the seed layer and the dielectric layer.

3. The method of claim 2, wherein the barrier layer is tantalum (Ta), titanium nitride (TiN), titanium silicon nitride (TiSiN) or tungsten nitride (WNx).

4. The method of claim 1, wherein the low temperature is less than 100° C.

5. The method of claim 4, wherein the long period of time is between approximately 8 and 24 hours.

6. The method of claim 1, wherein the higher temperature is in a range from 250° C. to 350° C.

7. The method of claim 1, wherein the low temperature is 80° C. or less.

8. A method of forming a copper structure in an integrated circuit fabrication process, the method comprising:
   providing a copper seed layer;
   electroplating the seed layer to provide copper material;
   providing a first anneal at a temperature less than 100° C. for a period of greater than 8 hours to form large grain sizes in the copper material, the large grain sizes being between approximately 2,500 and 10,000 angstroms; and
   providing a second anneal to distribute alloy elements uniformly in the copper material.

9. The method of claim 8, wherein the first anneal causes grain growth in the copper material.

10. The method of claim 8, wherein the second anneal is performed at a higher temperature than the first anneal.

11. The method of claim 8, wherein the alloy elements include at least one element selected from the group consisting of tin (Sn), calcium (Ca), chromium (Cr), zinc (Zn), zirconium (Zr), hafnium (Hf), and lanthanum (La).

12. The method of claim 8, further comprising:
    providing the alloy elements in a layer above the copper material.

13. The method of claim 8, wherein the alloy elements are included in the seed layer.

14. The method of claim 13, further comprising providing additional alloy elements in a layer above the copper material.

15. The method of claim 8, wherein the first anneal occurs at a temperature of approximately 60° C.

16. The method of claim 8, wherein the first anneal is for a period of between 8 and 24 hours.

17. The method of claim 8, wherein the second anneal is performed at a temperature between 250° C. and 350° C.

18. The method of claim 8, wherein the first anneal is performed at a temperature of 80° C. or less.

19. A method of forming a damascene conductive structure in an integrated circuit, the method comprising:
    providing a copper layer;
    providing a source of at least one alloy element;
    first annealing the copper layer to cause grain growth over a long period of time, the long period of time being greater than 8 hours; and
    second annealing the copper layer to distribute the at least one alloy element in the copper layer.

20. The method of claim 19, wherein the first annealing occurs at temperatures of less than 100° C.

21. The method of claim 19, wherein the second annealing is performed after the first annealing.

22. The method of claim 20, wherein the second annealing is performed at temperatures over 250° C. and for a time of less than 1 hour.

23. The method of claim 19, wherein the at least one alloy element includes at least one element selected from the group consisting of zirconium (Zr), hafnium (Hf), and lanthanum (La).

* * * * *